(12) United States Patent
Thurner et al.

(10) Patent No.: US 12,213,229 B2
(45) Date of Patent: Jan. 28, 2025

(54) ILLUMINATION DEVICE, OPTICAL CAMERA AND METHOD FOR MONITORING AN OPTICAL OUTPUT POWER OF A LIGHT SOURCE

(71) Applicant: Infineon Technologies AG, Neubiberg (DE)

(72) Inventors: Thomas Thurner, Graz (AT); Patrick Fleischanderl, Graz (AT)

(73) Assignee: Infineon Technologies AG, Neubiberg (DE)

( * ) Notice: Subject to any disclaimer, the term of this patent is extended or adjusted under 35 U.S.C. 154(b) by 165 days.

(21) Appl. No.: 18/055,053

(22) Filed: Nov. 14, 2022

(65) Prior Publication Data

US 2023/0189420 A1 Jun. 15, 2023

(30) Foreign Application Priority Data

Dec. 14, 2021 (EP) ..................................... 21214520

(51) Int. Cl.
| | |
|---|---|
| *H05B 47/14* | (2020.01) |
| *G01R 1/07* | (2006.01) |
| *G01R 15/20* | (2006.01) |
| G01R 1/20 | (2006.01) |
| H04N 23/56 | (2023.01) |

(52) U.S. Cl.
CPC .............. *H05B 47/14* (2020.01); *G01R 1/07* (2013.01); *G01R 15/20* (2013.01); *G01R 1/203* (2013.01); *H04N 23/56* (2023.01)

(58) Field of Classification Search
CPC ........ H05B 47/14; H05B 47/22; H05B 45/30; G01R 1/07; G01R 15/20; G01R 15/207; G01R 31/44

USPC ........................................................ 315/307
See application file for complete search history.

(56) References Cited

U.S. PATENT DOCUMENTS

| | | | | |
|---|---|---|---|---|
| 4,999,571 A | * | 3/1991 | Ishiko .................. | G01R 15/142 324/96 |
| 6,201,318 B1 | * | 3/2001 | Guillory ................ | G01R 31/44 323/368 |
| 10,251,240 B1 | * | 4/2019 | Yang .................... | H05B 47/175 |

(Continued)

FOREIGN PATENT DOCUMENTS

WO 2021204816 A1 10/2021

OTHER PUBLICATIONS

Extended European Search Report for Application No. EP20210214520, mailed on Jun. 17, 2022, 8 Pages.

(Continued)

*Primary Examiner* — Ryan Jager
(74) *Attorney, Agent, or Firm* — Harrity & Harrity, LLP (57) ABSTRACT

An illumination device is provided. The illumination device includes a light source and a current path configured to transport a supply current to the light source. Further, the illumination device includes a sensor configured to contactlessly measure a current strength of the supply current in the current path and to output a measurement signal indicative of the measured current strength. The illumination device additionally includes processing circuitry coupled to the sensor and configured to determine the optical output power of the light source based on the measured current strength indicated by the measurement signal.

19 Claims, 7 Drawing Sheets

(56) References Cited

U.S. PATENT DOCUMENTS

| | | | | |
|---|---|---|---|---|
| 2005/0276294 A1* | 12/2005 | Crawford | ........... | H05B 45/3725 |
| | | | | 372/38.07 |
| 2019/0045600 A1* | 2/2019 | Zenteno | ............... | H05B 47/175 |
| 2023/0288641 A1* | 9/2023 | Judendorfer | ......... | G01R 15/246 |

OTHER PUBLICATIONS

Ripka, "Electric current sensors: a review," Topical Review, Measurement Science and Technology, IOP Publishing, vol. 21, No. 11, Sep. 24, 2010, 23 pages.

\* cited by examiner

ILLUMINATION DEVICE, OPTICAL CAMERA AND METHOD FOR MONITORING AN OPTICAL OUTPUT POWER OF A LIGHT SOURCE

CROSS REFERENCE TO RELATED APPLICATION

This application claims priority to European Patent Application No. 21214520 filed on Dec. 14, 2021, the content of which is incorporated by reference herein in its entirety.

TECHNICAL FIELD

The present disclosure relates to monitoring an optical output power of a light source. In particular, examples of the present disclosure relate to an illumination device, an optical camera and a method for monitoring an optical output power of a light source.

BACKGROUND

Cameras included in consumer products (e.g., a smartphone) need to fulfill eye-safety regulations such as class 1 of the international laser safety standard (EN 60825). The used active illumination elements such as laser diodes are capable of providing several Watts of optical power. Special sensing and circuitry are used to monitor the emitted optical power, ensuring that while having peak power levels in the order of several watts for short laser pulses, all measures required for eye-safe and skin-safe operation on pulse-, pulse-train- and average optical power levels are fulfilled.

Conventionally, so-called monitor photodiodes are used. The monitor photodiodes are integrated inside the illumination module to directly sense a small fraction of the optical output power and convert it into current or voltage. A monitor photodiode allows to directly measure the optical power without significant additional power loss in the camera module. However, it is disadvantageous that a monitor diode needs to be installed in the illumination unit (e.g., a laser diode package) and that an additional readout circuitry is required.

In other conventional examples, a shunt resistor is used in the laser diode driving wire to sense the laser diode forward current flow. The current through a laser diode is proportional to the emitted optical power to a high degree. As a big drawback, the shunt-based approach comes with considerable energy/power loss. This method always leads to a voltage drop and power loss in the illumination circuit, so that the overall power consumption of such a module is increased. This is a very critical with respect to battery life in any mobile application. In addition, the power dissipation on the shunt resistor (e.g., up to 0.5 W) additionally heats up the module—which of course is not wanted.

Hence, there may be a demand for improved monitoring of a light source's optical output power.

SUMMARY

The demand may be satisfied by the subject-matter of the appended claims.

An example relates to an illumination device. The illumination device includes a light source and a current path configured to transport a supply current to the light source. Further, the illumination device includes a sensor configured to contactlessly measure a current strength of the supply current in the current path and to output a measurement signal indicative of the measured current strength. The illumination device additionally includes processing circuitry coupled to the sensor and configured to determine the optical output power of the light source based on the measured current strength indicated by the measurement signal.

Another example relates to an optical camera. The optical camera includes an illumination device as described herein and an image sensor. The image sensor is configured to generate measurement data based on received reflections of light output by the light source.

A further example relates to a method for monitoring an optical output power of a light source. The method includes contactlessly measuring a current strength of a supply current for the light source flowing through a current path using a sensor. Additionally, the method includes determining the optical output power of the light source based on the measured current strength.

BRIEF DESCRIPTION OF THE DRAWINGS

Some examples of apparatuses and/or methods will be described in the following by way of example only, and with reference to the accompanying figures, in which.

DETAILED DESCRIPTION

Some examples are now described in more detail with reference to the enclosed figures. However, other possible examples are not limited to the features of these implementations described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, e.g., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Figure 1:
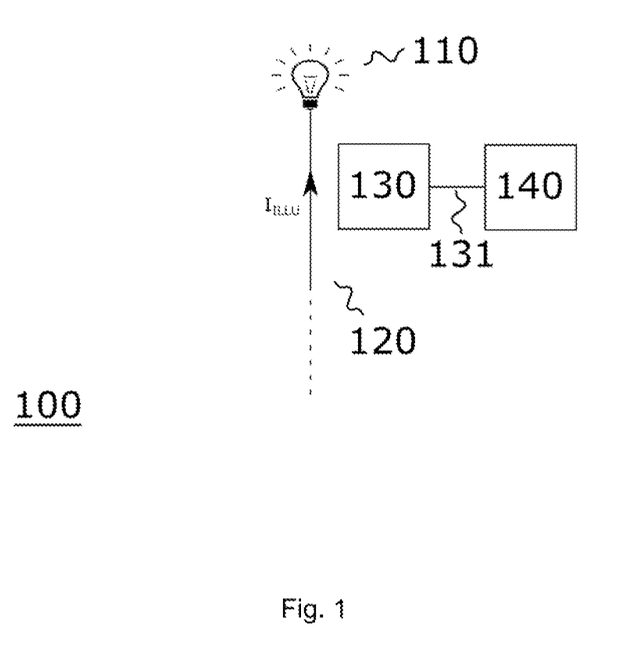
FIG. 1 illustrates a first example of an illumination device.

FIG. 1 illustrates an example illumination device 100. The illumination device 100 comprises at least one light source 110. The light source 110 may be any kind of optical emitter. In particular, the light source 110 may be configured to controllably emit light of one or more predetermined wavelength. The light source 110 may comprise a single light-emitting device or a plurality of light-emitting devices such as an array of light-emitting devices. For example, the light source 110 may comprise one or more Light-Emitting Diode (LED) or one or more laser diode such as one or more Vertical-Cavity Surface-Emitting Laser (VCSEL). The light source 110 may, e.g., comprise a VCSEL array. In the example of FIG. 1, exactly one light source 110 is illustrated. However, it is to be noted that according to examples, the illumination device 100 may comprise more than one light source, e.g., a plurality of light sources.

The illumination device 100 further comprises a current path 120 configured to transport (conduct) a supply current $I_{ILLU}$ to the at least one light source 110. The current path 120 may be any structure capable of transporting (conducting) current. For example, the current path 120 may be an electrically conductive wire, trace or path. For example, the current path 120 may couple the at least one light source 110 to a power supply (not illustrated in FIG. 1) providing the supply current $I_{ILLU}$.

Additionally, the illumination device 100 comprises a sensor 130 configured to contactlessly measure a current strength of the supply current $I_{ILLU}$ in the current path 120. The sensor 130 is further configured to output a measurement signal 131 indicative of the measured current strength. The sensor 130 is placed in proximity to the current path 120. For example, the sensor 130 may be arranged sideways of the current path 120 as illustrated in FIG. 1. However, the present disclosure is not limited thereto. In other examples, the sensor 130 may, e.g., be arranged on top of the current path 120. No conductive path is formed between the sensor 130 and the current path 120. In other words, the sensor 120 is galvanically isolated from the current path 120. However, the sensor 130 may physically contact the current path 120. For example, the sensor 120 and/or the current path may comprise a respective electrically isolating housing (casing) that allows to galvanically isolate the electrically conductive elements of the sensor 130 from the electrically conductive elements of the current path 120. In other examples, one or more intermediate elements may be arranged between the sensor 130 and the current path 120. For example, an isolating element (device) or an air gap may be arranged between the sensor 130 and the current path 120. The sensor 130 may, e.g., be spaced apart from the current path by a few millimeters (e.g., less than 5 mm or 10 mm) up to a few centimeters (e.g., less 2 cm, 3 cm, 4 cm or 5 cm).

The sensor 130 uses a contactless measurement principle for measuring the current strength of the supply current $I_{ILLU}$ in the current path 120. The sensor 130 may, e.g., be configured to couple to the current path electrically or magnetically. For example, the sensor 130 may be a magnetic field sensor. The magnetic field sensor 130 may, e.g., be a Hall effect based sensor configured to measure the current strength of the supply current $I_{ILLU}$ using the Hall effect. In other examples, the magnetic field sensor 130 may, e.g., be a magnetoresistive sensor. In other words, the sensor 130 may comprise material (e.g., ferromagnetic material) or material structure that changes the value of its electrical resistance based on an externally-applied magnetic field, which is caused by the supply current $I_{ILLU}$ in the current path 120. Accordingly, the sensor 130 is sensitive to the current strength of the supply current $I_{ILLU}$ in the current path 120. The magnetoresistive sensor 130 may, e.g., be configured to measure the current strength of the supply current $I_{ILLU}$ using one or more of the Anisotropic MagnetoResistance (AMR) effect, the Giant MagnetoResistance (GMR) effect and the Tunnel MagnetoResistance (TMR) effect. In some examples, the magnetic field sensor 130 may use both the Hall effect and one or more magnetoresistive effect for measuring the current strength of the supply current $I_{ILLU}$. In other examples, the sensor 130 may be a magnetooptical sensor. In other words, the sensor 130 may be based on a measurement principle in in which an electromagnetic wave propagates through a medium that is altered based on an externally-applied magnetic field, which is caused by the supply current $I_{ILLU}$ in the current path 120. For example, the magnetooptical sensor 130 may be configured to measure the current strength of the supply current $I_{ILLU}$ using the Faraday effect. In still other examples, the sensor 130 may, e.g., be a magnetically coupled sensor using an inductive coil for measuring the current strength of the supply current $I_{ILLU}$. For example, the magnetically coupled sensor 130 may be configured to measure a voltage across the inductive coil induced by a magnetic field caused by the supply current $I_{ILLU}$. However, it is to be noted that the present disclosure is not limited to the above contactless measurement principles for measuring the current strength of the supply current $I_{ILLU}$ in the current path 120. In general, any contactless measurement principle for measuring the current strength of a current flowing through an electrically conductive element may be used.

Processing circuitry 140 of the illumination device 100 is coupled to the sensor 130. For example, the processing circuitry 140 may be a single dedicated processor, a single shared processor, or a plurality of individual processors, some of which or all of which may be shared, a digital signal processor (DSP) hardware, an application specific integrated circuit (ASIC) or a field programmable gate array (FPGA). The processing circuitry 140 may optionally be coupled to, e.g., read only memory (ROM) for storing software, random access memory (RAM) and/or non-volatile memory. The processing circuitry 140 is configured to receive the measurement signal 131 and to determine the optical output power of the light source 110 based on the measured current strength indicated by the measurement signal 131. The optical output power of the light source 110 is the energy of light output (emitted) by the light source 110 per unit time. For example, the processing circuitry 140 may determine the optical output power of the light source 110 using a predefined or learned (trained) correlation between the optical output power of the light source 110 and the measured current strength of the supply current $I_{ILLU}$ in the current path 120. For example, the processing circuitry 140 may determine the optical output power of the light source 110 based on the assumption that the optical output power of the light source 110 scales substantially linear with the current strength of the supply current $I_{ILLU}$ in the current path 120 (e.g., over a certain current range).

The illumination device 100 may allow to indirectly determine (estimate) the optical output power of the light source 110 using non-contacting current sensing. Compared to conventional approaches using shunt resistors and/or monitor photodiodes, the illumination device 100 may allow to sense the supply current $I_{ILLU}$ in the current path 120 with minimum power consumption and reduced heat dissipation. Due to the sensor 130, no shunt resistor is needed to measure the optical output power of the light source 110. Neither a voltage drop nor significant heat dissipation appears from the current sensing. The sensor 130 may consume substantially less power (e.g., up to one or two orders of magnitude) than conventional shunt resistor-based measurement approaches. The illumination device 100 may, hence, allow to reduce an overall power consumption of the system compared to conventional approaches. Similarly, there might be no need for separate monitor photodiodes and corresponding readout circuitry. Accordingly, the illumination device 100 may be less complex and more efficient in terms of area consumption and costs than conventional monitor photodiode-based measurement approaches.

The information about the determined optical output power of the light source 110 may be used for controlling the light source 110. For example, the light source 110 may be controlled such that eye-safety and/or skin-safety regulations are met. According to some examples, the processing circuitry 140 may be used for controlling the light source 110. For example, the processing circuitry 140 may be further configured to control the current strength of the supply current $I_{ILLU}$ through the current path 120 based on the determined optical output power of the light source 110. The processing circuitry 140 may, e.g., control a power supply supplying the supply current $I_{ILLU}$ to the current path 120 to adjust the current strength of the supply current $I_{ILLU}$ (e.g., to a specific value or to decrease or increase the current strength of the supply current $I_{ILLU}$). For example, the processing circuitry 140 may transmit one or more corresponding control signal to the power supply. In other examples, the processing circuitry 140 may transmit information (data) about the determined optical output power of the light source 110 to the power supply (e.g., via one or more signal) or dedicated circuitry for controlling the power supply such that the power supply or the dedicated circuitry for controlling the power supply is able to adjust or control the power supply to adjust the current strength of the supply current $I_{ILLU}$ based on the information (data) about the determined optical output power of the light source 110.

As the sensor 130 is galvanically isolated from the current path 120, also the processing circuitry 140 is galvanically isolated from the current path 120. Accordingly, damaging of the sensor 130 and the processing circuitry 140 due to, e.g., overvoltage caused by the current path 120 may be avoided. Galvanically isolating the sensor 130 and the processing circuitry 140 from the current path 120 may, hence, allow to increase a safety of the illumination device 100.

According to some examples, the illumination device 100 additionally comprises a carrier substrate (e.g., a Printed Circuit Board, PCB; not illustrated in FIG. 1) holding (carrying) the various other elements of the illumination device 100. For example, the carrier substrate may hold one or more of the light sources 110, the current path 120, the sensor 130 and the processing circuitry 140.

The measurement settings of the sensor 130 may be fixedly predefined (preconfigured) or be adjustable. For example, a sensitivity of the sensor 130 or any other parameter of the sensor 130 may be adjustable. In other examples, the sensitivity of the sensor 130 or any other parameter of the sensor 130 may be fixedly predefined without separate communication or pre-assembly programming steps. The sensitivity of a sensor indicates how much a sensor's output changes when the input quantity being measured changes. Either in advance or during operation, the sensor 130 may be configured (adjusted) such that the sensor output is proportional to the sensed current strength of the supply current $I_{ILLU}$ through the current path 120. The sensor 130 may, e.g., be controlled by the processing circuitry 140. According to examples, the processing circuitry 140 may be further be configured to transmit control data to the sensor 130. Accordingly, the sensor 130 may be configured to adjust a sensor sensitivity based on the received control data. For example, the processing circuitry 140 and the sensor 130 may be coupled via an Inter-Integrated Circuit (I²C) bus.

In some examples, the illumination device 100 may further comprise switching circuitry (not illustrated in FIG. 1) for selectively switching the light source 110 on and off. For example, the switching circuitry may comprise a plurality of coupled transistors acting as switches for selectively switching the light source 110 on and off. Accordingly, the current path 120 may be part of the switching circuitry (e.g., a conductive trace or path connecting two of the plurality of coupled transistors) and further the sensor 130 may be integrated into the switching circuitry. Accordingly, a switching circuit with integrated current measurement capability of optical output power determination may be provided.

Further details of the proposed illumination device are described below with reference to FIGS. 2 to 9.

Figure 2:
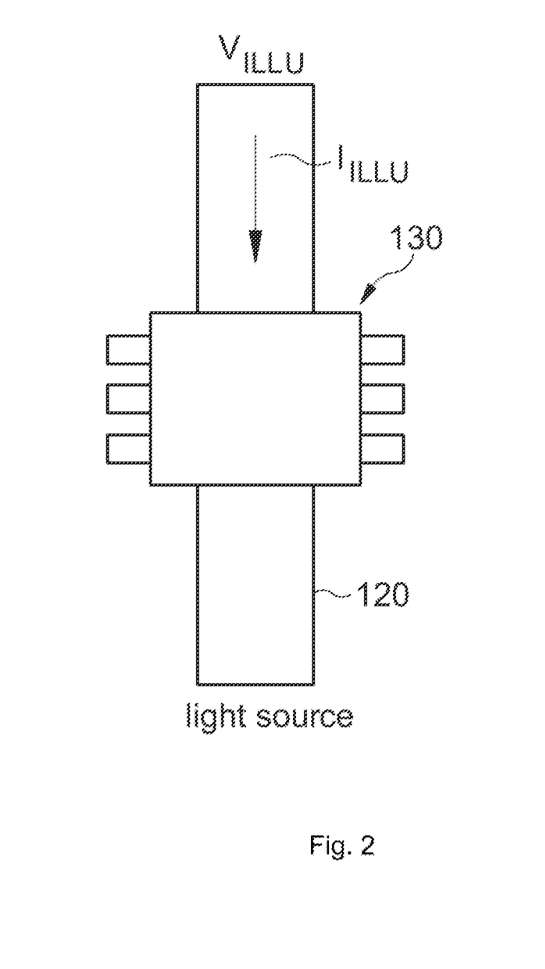
FIG. 2 illustrates a top view of an example arrangement of a sensor with respect to a current path.
Figure 3:
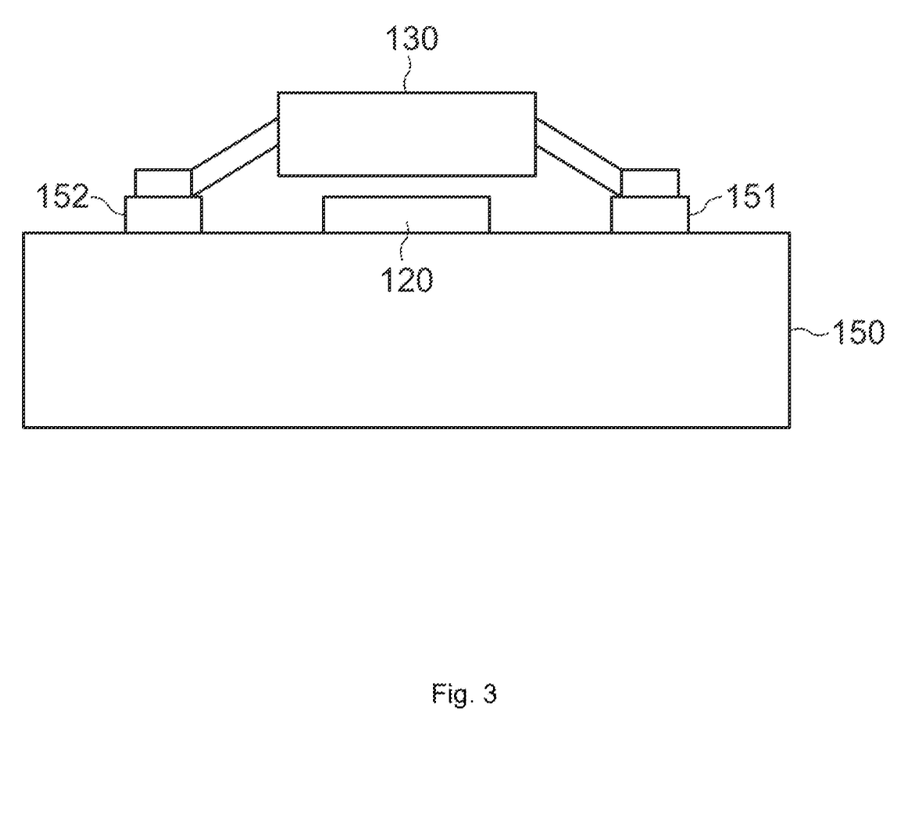
FIG. 3 illustrates a cross-sectional view of the example arrangement illustrated in FIG. 2.

FIG. 2 and FIG. 3 illustrate a first example arrangement of the sensor 130 with respect to the current path 120. FIG. 2 illustrates a top view of the example arrangement, whereas FIG. 3 illustrates a cross-sectional view of the example arrangement. As illustrated in FIG. 2, the supply current $I_{ILLU}$ flows through the current path 120 at a supply voltage $V_{ILLU}$ to the light source.

In the example of FIG. 2 and FIG. 3, the sensor 130 is arranged above the current path 120. As can be seen from FIG. 3, a carrier substrate 150 (e.g., a PCB) holds the current path 120 and the sensor 130 such that the current path 120 is arranged between the carrier substrate 150 and the sensor 130. The current path 120 may, e.g., be a conductive trace or path on the carrier substrate 150. Further illustrated in FIG. 3 are two contact (connection) pads 151 and 152 contacting input and/or output nodes (terminals) of the sensor 130 for coupling the sensor 130 to the processing circuitry (not illustrated in FIG. 3).

The sensor 130 may, e.g., be a Hall effect based sensor providing a Hall voltage proportional to current strength of the supply current $I_{ILLU}$ flowing through the current path 120. The Hall voltage of the sensor 130 is indicative of the measured current strength and, hence, allows the coupled processing circuitry to determine the optical output power of the light source. However, it is to be noted that any other sensor using a non-contacting measurement principle for measuring the current strength of a current may be used as well. For example, the sensor 130 may alternatively be a magnetoresistive sensor using resistance changes induced by the magnetic field coupled from the supply current $I_{ILLU}$ for generating an output signal indicative of the measured current strength. The magnetoresistive sensor may, e.g., comprise a bridge circuit with magnetoresistive elements to measure resistance changes proportional to magnetic field changes within the sensor 130.

Figure 4:
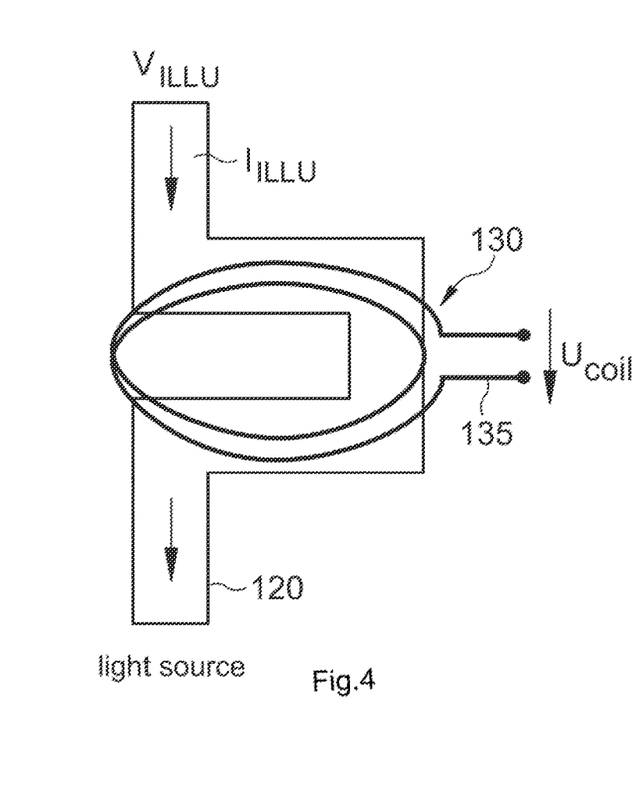
FIG. 4 illustrates a top view of another example arrangement of a sensor with respect to a current path.
Figure 5:
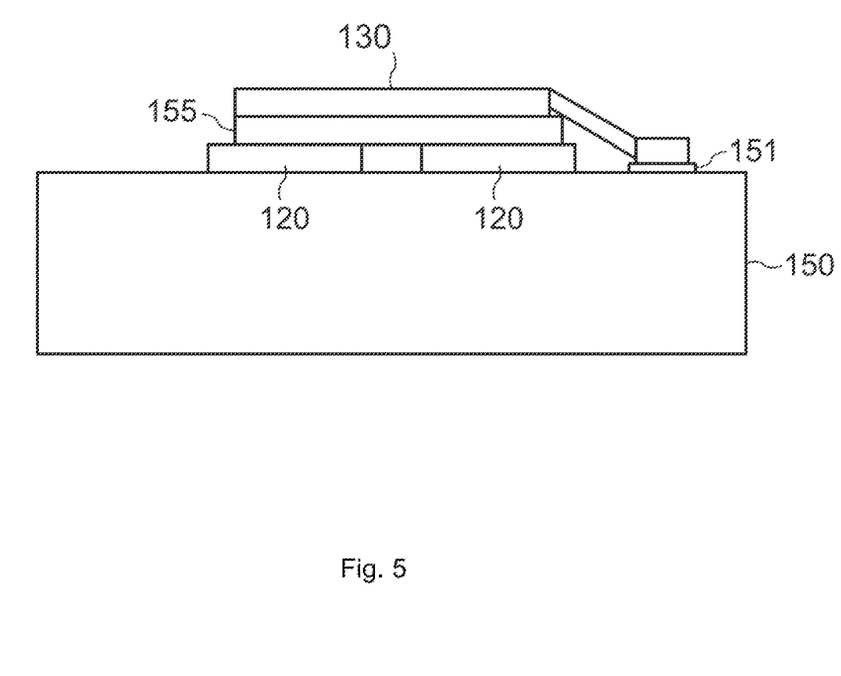
FIG. 5 illustrates a cross-sectional view of the example arrangement illustrated in FIG. 4.

FIG. 4 and FIG. 5 illustrate a second example arrangement of the sensor 130 with respect to the current path 120. FIG. 4 illustrates a top view of the example arrangement, whereas FIG. 5 illustrates a cross-sectional view of the example arrangement. As illustrated in FIG. 4, the supply current $I_{ILLU}$ flows through the current path 120 at a supply voltage $V_{ILLU}$ to the light source.

As can be seen from FIG. 4, the carrier substrate 150 (e.g., a PCB) again holds the current path 120 and the sensor 130 such that the current path 120 is arranged between the carrier substrate 150 and the sensor 130.

In the example of FIG. 4 and FIG. 5, the sensor 130 is a magnetically coupled sensor and comprises an inductive coil 135 for measuring the current strength of the supply current $I_{ILLU}$ flowing through the current path 120. In order to maximize the surface (or volume) of the current path 120 covered and, hence, sensed by the coil 135 of the sensor, the current path 120 exhibits a meandering shape. However, it is to be noted that the present disclosure is not limited thereto. The current path 120 may exhibit any other shape as well.

The sensor 130 is configured to measure the voltage $U_{coil}$ across the inductive coil 135, which is induced by a magnetic field caused by the supply current supply current $I_{ILLU}$ flowing through the current path 120. The voltage $U_{coil}$ across the inductive coil 135 is indicative of the measured current strength and, hence, allows the coupled processing circuitry to determine the optical output power of the light source.

Further illustrated in FIG. 5 is a contact (connection) pad 151 contacting input and/or output nodes (terminals) of the sensor 130 for coupling the sensor 130 to the processing circuitry (not illustrated in FIG. 5). In the example of FIG. 4 and FIG. 5, a spacer 155 is arranged between the sensor 130 and the current path 120. The spacer 155 is made of an electrically non-conductive material and acts as isolating element (device) to ensure galvanic isolation between the sensor 130 and the current path 120.

Figure 6:
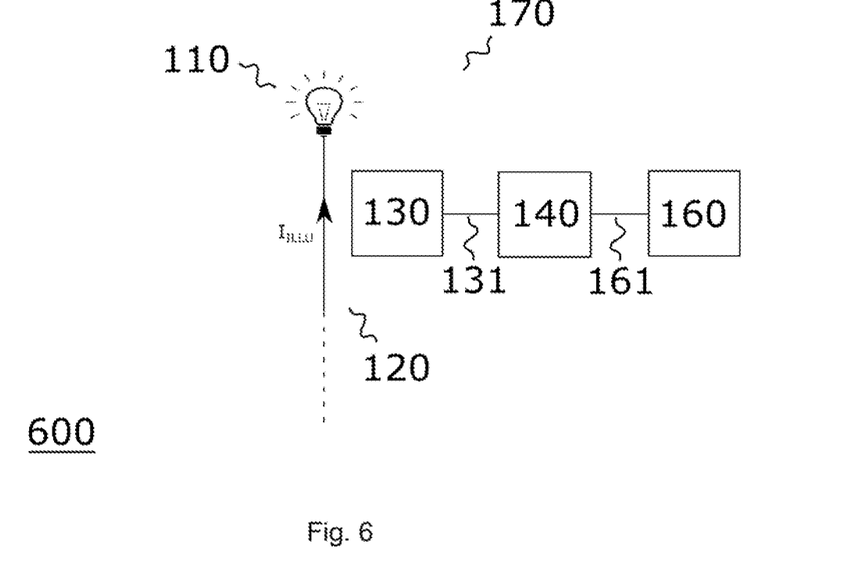
FIG. 6 illustrates a second example of an illumination device.

FIG. 6 illustrates another illumination device 600. The illumination device 600 is substantially identical to the illumination device 100 described above. In the example of FIG. 6, the sensor 130 is a magnetic field sensor such as a Hall effect based sensor or a magnetoresistive sensor. The magnetic field sensor 130 may provide a bandwidth of up to few MHz, which might be sufficient for short time averaged current monitoring as required to be conform with relevant eye safety standards. The magnetic field sensor 130 sensor may provide a typical low pass characteristic from DC up to the given bandwidth.

The magnetic field sensor 130 is susceptible to outside (external) magnetic fields. Therefore, in comparison to the illumination device 100, the illumination device 600 additionally comprises another magnetic field sensor 160 spaced apart from the magnetic field sensor 130. The magnetic field sensor 160 is configured to measure a magnetic field strength of a magnetic field in an environment of the illumination device 600 and to output a measurement signal 161 indicative of the measured magnetic field strength. The magnetic field sensor 160 is placed at a short distance from the magnetic field sensor 130 (e.g., a few millimeters to a few centimeters, less than 1 cm, less than 2 cm or less than 5 cm). Accordingly, the reading of the magnetic field sensor 160 may be used to compensate for the effects of the external magnetic field in the environment of the illumination device 600 on the measurement signal 131 of the magnetic field sensor 130.

In the example of FIG. 6, the processing circuitry 140 is coupled to the magnetic field sensor 160 and configured to further determine the optical output power of the light source 110 based on the measured current strength indicated by the measurement signal 131 and further based on the measured magnetic field strength indicated by the measurement signal 161. In particular, the processing circuitry 140 is configured to compensate for the effects of the external magnetic field in the environment of the illumination device 600 on the measurement signal 131 using the measurement signal 161.

In other words, FIG. 6 illustrates a differential sensing approach using two sensors 130 and 160, wherein the magnetic field sensor 160 measures the static magnetic field outside the vicinity of the conducting current path 120.

In alternative examples, the above described compensation functionalities may be provided within the magnetic field sensor 130 such that the measurement signal 131 is compensated for the effects of the external magnetic field in the environment of the illumination device 600.

Figure 7:
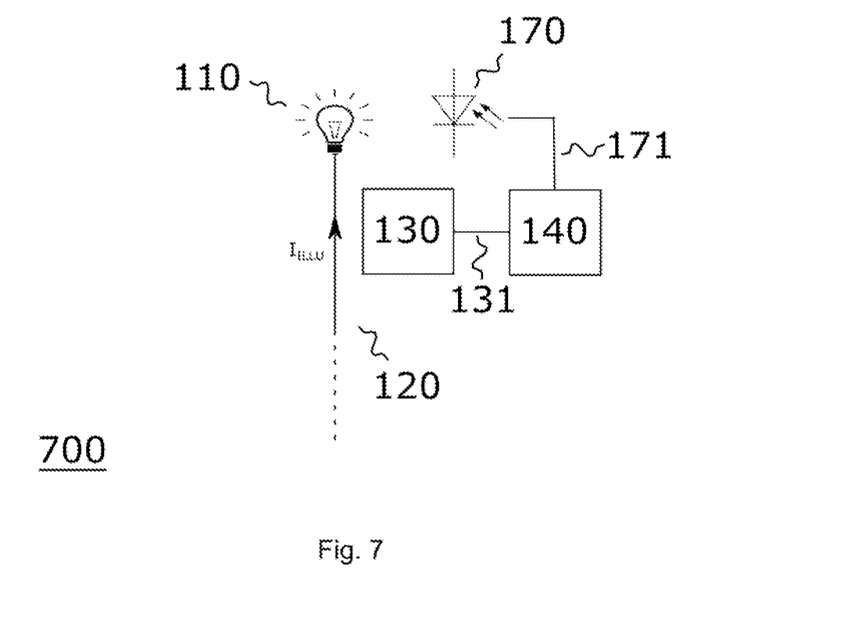
FIG. 7 illustrates a third example of an illumination device.

FIG. 7 illustrates a further illumination device 700. The illumination device 700 is substantially identical to the illumination device 100 described above. In comparison to the illumination device 100, the illumination device 700 additionally comprises an optical sensor 170. For example, the optical sensor 170 may be (comprise) one or more photodiode. The optical sensor 170 is configured to measure (at least a fraction, e.g., a defined fraction of) an optical power output by the light source 110 and to output a measurement signal 171 indicative of the measured optical power.

In the example of FIG. 7, the processing circuitry 140 is coupled to the optical sensor 170 and configured to determine the optical output power of the light source 110 based on the measured current strength indicated by the measurement signal 131 and further based on based on the measured optical power indicated by the measurement signal 171.

In other words, FIG. 7 illustrates a redundant sensing approach using the measurement signals 131 and 171 of two different sensor types as input for the determination of the optical output power of the light source 110. This may allow to increase the functional safety aspects of the illumination device 700 compared to the illumination device 100. For example, the illumination device 700 may be beneficial to achieve a higher Automotive Safety Integrity Level (ASIL) on camera system level than with the illumination device 100 alone. Further, the reliability for monitoring of the illumination device 700 eye safety and/or skin safety may be increased compared to the illumination device 100.

Figure 8:
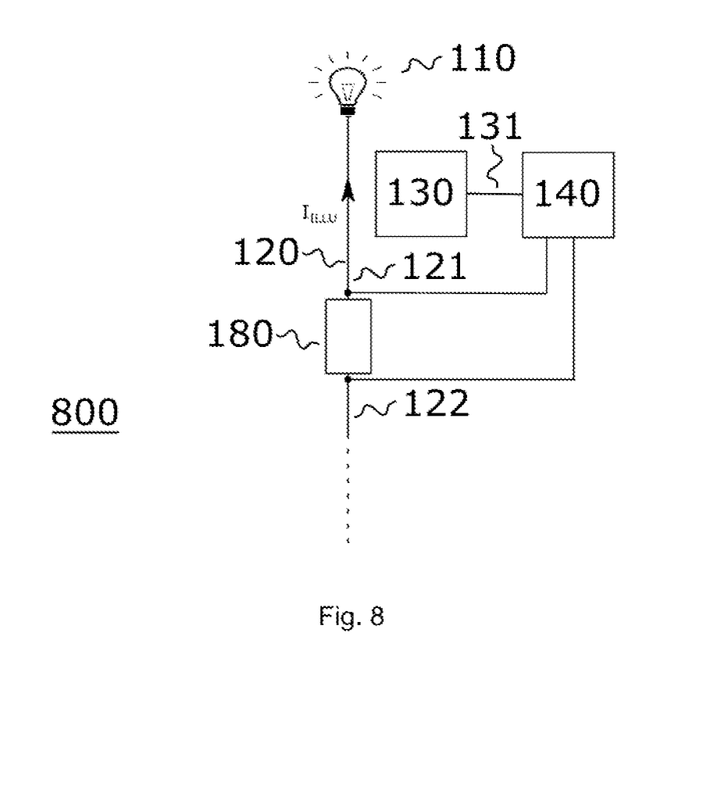
FIG. 8 illustrates a fourth example of an illumination device.

A still further illumination device 800 using a redundant sensing approach is illustrated in FIG. 8. The illumination device 800 is substantially identical to the illumination device 100 described above. In comparison to the illumination device 100, the illumination device 800 additionally comprises a shunt resistor 180 coupled in series between two (directly) succeeding sections 121 and 122 of the current path 120.

In the example of FIG. 8, the processing circuitry 140 is coupled to the connection nodes (terminals) of the shunt resistor 180 to measure the voltage drop over the shunt resistor 180. The processing circuitry 140 is configured to determine the optical output power of the light source 110 based on the measured current strength indicated by the measurement signal 131 and further based on voltage drop over the shunt resistor 180.

Like in the example of FIG. 7, the illumination device 800 provides a redundant sensing approach using the measurement signals 131 and 181 of two different sensor types as input for the determination of the optical output power of the light source 110. This may allow to increase the functional safety capabilities of the illumination device 800 compared to the illumination device 100.

Figure 9:
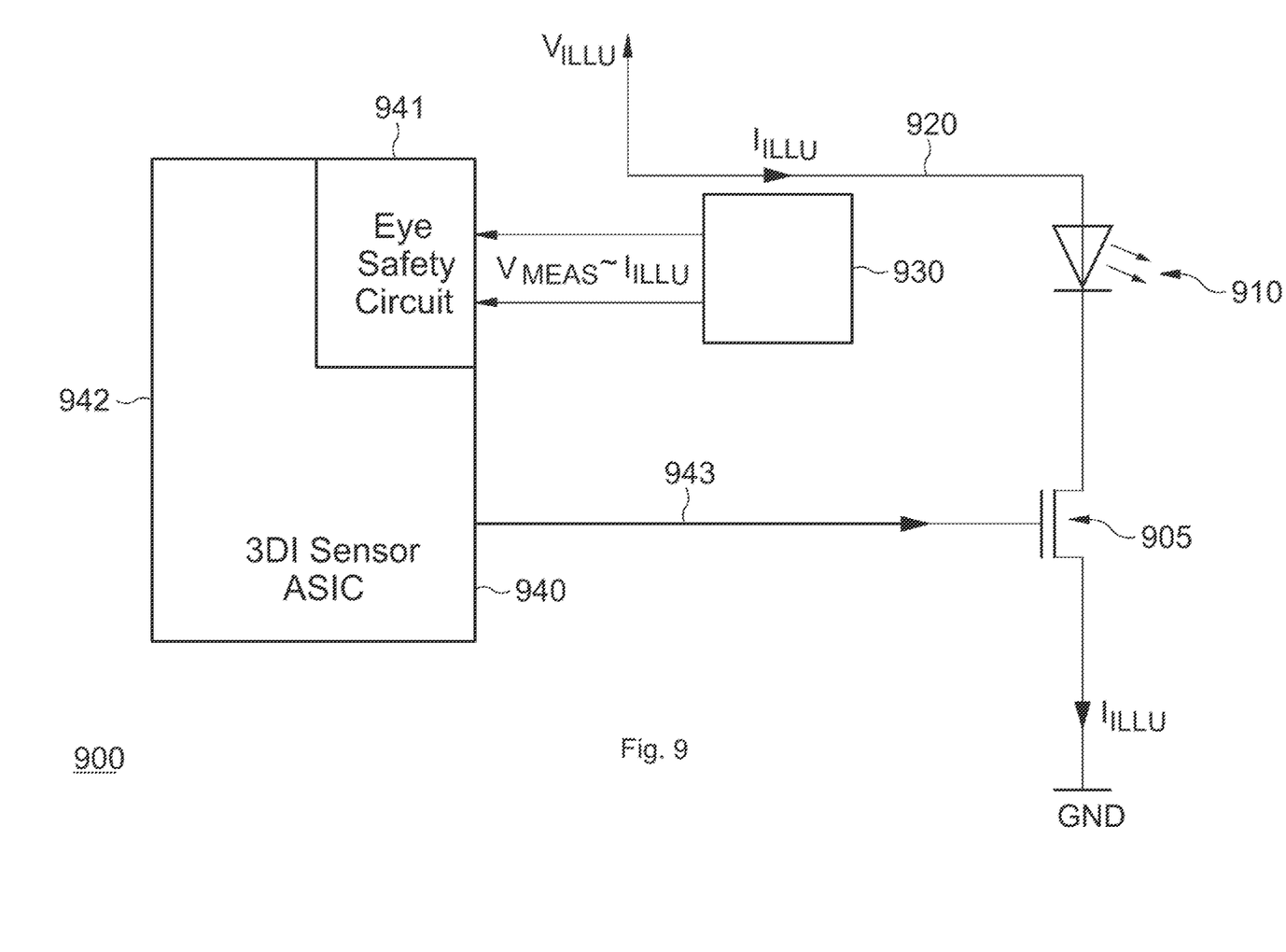
FIG. 9 illustrates a fifth example of an illumination device.

FIG. 9 illustrates another illumination device 900. The illumination device 900 comprises a light source 910 (e.g., a VCSEL) and a current path 920 coupling the light source 910 between a power supply (not illustrated) providing an electrical supply power and ground (GND).

Further illustrated is a transistor switch 905 for selectively switching the light source 910 on and off. The transistor switch 905 is coupled between the light source 910 and GND. As illustrated in FIG. 9, a supply current $I_{ILLU}$ flows through the current path 920 when the transistor switch 905 is closed (e.g., in a conducting state).

The transistor switch 905 is controlled by processing circuitry 940 of the illumination device 900. In particular, the processing circuitry comprises sub-circuitry 942 implemented as an ASIC for controlling the transistor switch 905. The sub-circuitry 942 supplies a control signal 943 to a control node (terminal) of the transistor switch 905 (e.g., a gate node/terminal of the transistor switch 905) for opening and closing the transistor switch 905 (e.g., for driving the transistor switch 905 either in the conducting state or the non-conducting state).

The illumination device 900 further comprises a sensor 930 configured to contactlessly measure a current strength of the supply current $I_{ILLU}$ flowing through the current path 920. The sensor 930 may, e.g., be a magnetic field sensor such as a Hall effect based sensor outputting a measurement voltage $V_{MEAS}$ proportional to the current strength of the supply current $I_{ILLU}$.

The sensor 930 is coupled to the processing circuitry 940. In particular, the sensor 930 is coupled to sub-circuitry 941 of the processing circuitry 940. The sub-circuitry 941 is configured to determine the optical output power of the light source 920 based on the measurement voltage $V_{MEAS}$, e.g., based on the measured current strength indicated by the measurement signal of the sensor 930.

Similar what is described above, the illumination device 900 may allow indirect optical output power determination based on current sensing. The illumination device 900 may exhibit significantly reduced power consumption and heat dissipation compared to conventional optical output power measurement approaches using shunt resistors in the current path or photodiodes.

In alternative examples, one or more of the sensor 930, the transistor switch 905 and the sub-circuitry 941 may be integrated into the same semiconductor device or package. For example, the sensor 930 and the transistor switch 905 may be integrated into a single semiconductor device or package. Optionally, the sub-circuitry 941 may be integrated together with the sensor 930 and the transistor switch 905 into a single semiconductor device or package. This may allow to reduce circuitry complexity and, hence, size and costs.

An illumination device as proposed herein may be used for various applications. For example, an illumination device as proposed herein may be used for automotive illumination systems (solutions) or laser illumination systems (solutions). Further, an illumination device as proposed herein may be used for any kind of optical camera. For example, an illumination device as proposed herein may be used in a Time-of-Flight (ToF) system such as a single-point, 1D, 2D or 3D LIght Detection And Ranging (LIDAR) system or any other 3D imaging system.

Figure 10:
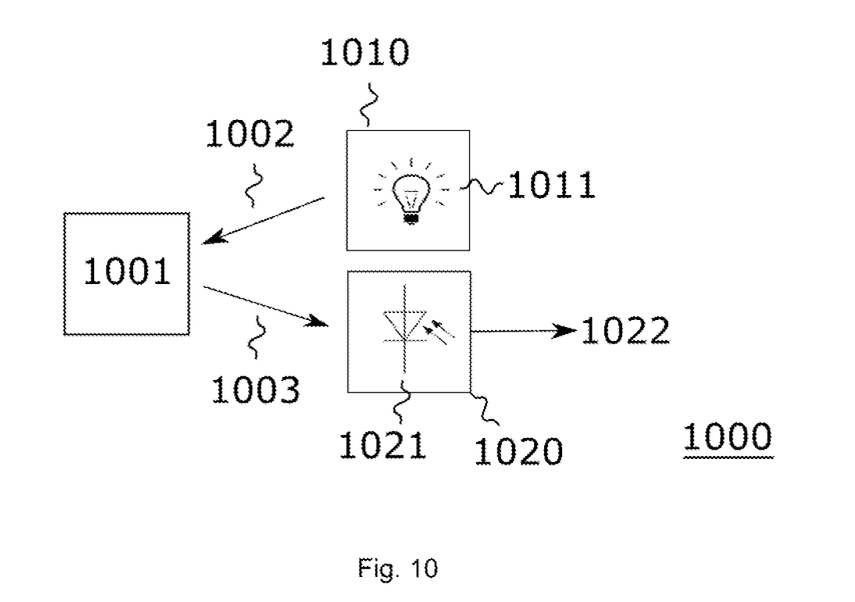
FIG. 10 illustrates an example of an optical camera.

An example optical camera 1000 is illustrated in FIG. 10. The optical camera 1000 comprises an illumination device 1010 as described herein. Only the light source 1011 of the illumination device 1010 is illustrated in FIG. 10 for reasons of simplicity. The light source 1011 outputs (emits) light 1002 to a scene. For example, the light source 1011 may selectively emit the light 1002 toward the scene based on one or more illumination (control) signal. The light 1002 may, e.g., be modulated light (e.g., one or more sequence of light pulses) or single light pulses. The illumination device 1010 and or the optical camera 1000 may comprise one or more additional light source for illuminating the scene.

An object 1001 is located in the scene and reflects the emitted modulated light 1002. The object 1001 may be any kind of physical object. The reflected light 1003 travels at least partially (for diffuse reflections) back to the optical camera 1000.

The optical camera 1000 further comprises an image sensor (optical sensor) 1020 configured to receive (capture) at least part of the reflected light 1003. The image sensor 1020 may comprise various components such as e.g., optics (e.g., one or more lens) and electronic circuitry. In particular, the electronic circuitry comprises at least one photo-sensitive sensor element or pixel 1021 (e.g., comprising a Photonic Mixer Device, PMD, a (potentially gated) photodiode, an Avalanche Photo Diode, APD, a Single Photon Avalanche Diode, SPAD, a Silicon Photo Multiplier, SIPM, or a Charge-Coupled Device, CCD). For example, the image sensor 1020 may comprise a plurality of photo-sensitive sensor elements or pixels (e.g., N≥2 photo-sensitive sensor elements or pixels). The at least one photo-sensitive sensor element or pixel may be driven based on one or more drive (reference) signal. The image sensor 1020 is configured to generate and output measurement data 1022 based on the reflected light 1003 received by the image sensor 1020. The measurement data 1022 may indicate one or more quantities of the reflected light 1003 and/or one or more quantities related to the reflected light 1003 such as, e.g., a light intensity, a change in light intensity, a ToF, a brightness, a change in brightness, a color of light, etc.

In general, the image sensor 1020 may be any type of sensor that is able to measure a physical quantity of the light (such as the reflected light 1003) and then translate it into a form that is readable by further electronic circuitry. In particular, the image sensor 1020 may be any type of sensor that is able to convert light or a change in light into an electronic signal. For example, the image sensor 1020 may be a frame based image sensor comprising photo-sensitive sensor elements or pixels that operate uniformly and synchronously to detect light framewise. Alternatively, the image sensor 1020 may, e.g., be a LIDAR sensor or a ToF sensor measuring a ToF of the emitted light 1002 using the reflected light 1003 received at the image sensor 1020. Further alternatively, the image sensor 1020 may, e.g., be an event based vision sensor such as a dynamic vision sensor (also known as event camera, neuromorphic camera or silicon retina) that responds to local changes in brightness. An event based vision sensor does not capture an images/frames using a shutter like a conventional image sensor does. Instead, the photo-sensitive sensor element or pixels of an event based vision sensor operate independently and asynchronously, detecting changes in brightness as they occur, and staying silent otherwise.

The optical camera 1000 may allow indirect optical output power determination for the light source 1011 based on current sensing. The optical camera 1000 may consume significantly less power and reduce heat dissipation compared to conventional optical output power measurement approaches. Further, the optical camera 1000 may enable increased eye and/or skin safety.

The above described elements of the optical camera 1000 may be arranged on one or more carrier substrate. For example, the above described elements of the optical camera 1000 may be arranged (encapsulated) in a common camera module.

The optical camera 1000 may be used for various applications. For example, the optical camera 1000 may be used in a mobile device, e.g., battery driven device, such as a mobile phone, a smartphone, a tablet-computer, augmented reality goggles or virtual reality goggles. However, it is to be noted that the present disclosure is not limited thereto.

Figure 11:
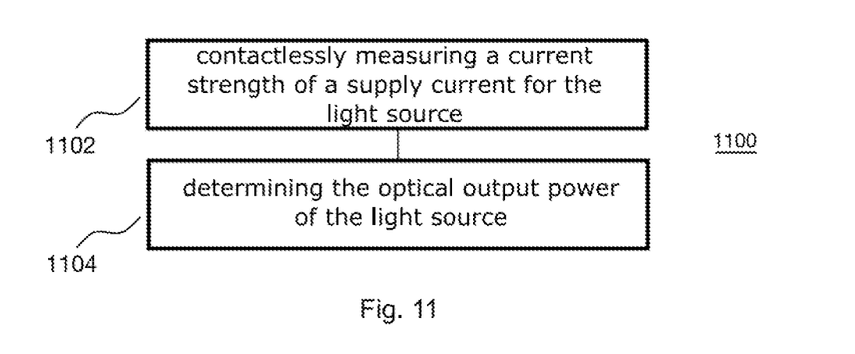
FIG. 11 illustrates a flowchart of an example of a method for monitoring an optical output power of a light source.

FIG. 11 further illustrates a flowchart of an example of a method 1100 for monitoring an optical output power of a light source. The method 1100 comprises contactlessly measuring 1102 a current strength of a supply current for the light source flowing through a current path using a sensor. Additionally, the method 1100 comprises determining 1104 the optical output power of the light source based on the measured current strength.

Similar what is described above, the method 1100 may allow indirect optical output power determination based on current sensing. The method 1100 may consume significantly less power and reduce heat dissipation compared to conventional optical output power measurement approaches.

More details and aspects of the method 1100 are explained in connection with the proposed technique or one or more example described above. The method 1100 may comprise one or more additional optional features corresponding to one or more aspects of the proposed technique or one or more example described above.

Aspects of the present disclosure may allow non-contacting current sensing for 3DI or ToF eye safety. In particular, use of a non-contacting sensor for illumination current monitoring within a 3DI camera, instead of a shunt resistor in the current path is enabled.

ASPECTS

The aspects as described herein may be summarized as follows:

Aspect 1 is an illumination device. The illumination device comprises a light source and a current path configured to transport a supply current to the light source. Further, the illumination device comprises a sensor configured to contactlessly measure a current strength of the supply current in the current path and to output a measurement signal indicative of the measured current strength. The illumination device additionally comprises processing circuitry coupled to the sensor and configured to determine the optical output power of the light source based on the measured current strength indicated by the measurement signal.

Aspect 2 is the illumination device of aspect 1, wherein the sensor is configured to couple to the current path electrically or magnetically.

Aspect 3 is the illumination device of aspect 1 or aspect 2, wherein the sensor is a magnetic field sensor.

Aspect 4 is the illumination device of aspect 3, wherein the magnetic field sensor is configured to measure the current strength of the supply current using one or more of the Hall effect and a magnetoresistive effect.

Aspect 5 is the illumination device of aspect 4, wherein the magnetoresistive effect is one or more of the anisotropic magnetoresistance effect, the giant magnetoresistance effect and the tunnel magnetoresistance effect.

Aspect 6 is the illumination device of any one of aspects 3 to 5, further comprising another magnetic field sensor spaced apart from the magnetic field sensor, wherein the other magnetic field sensor is configured to measure a magnetic field strength of a magnetic field in an environment of the illumination device and to output a second measurement signal indicative of the measured magnetic field strength, and wherein the processing circuitry is coupled to the magnetic field sensor and configured to further determine the optical output power of the light source based on the measured magnetic field strength indicated by the second measurement signal.

Aspect 7 is the illumination device of aspect 1 or aspect 2, wherein the sensor is a magnetooptical sensor.

Aspect 8 is the illumination device of aspect 7, wherein the magnetooptical sensor is configured to measure the current strength of the supply current using the Faraday effect.

Aspect 9 is the illumination device of aspect 1 or aspect 2, wherein the sensor is a magnetically coupled sensor using an inductive coil for measuring the current strength of the supply current.

Aspect 10 is the illumination device of aspect 9, wherein the magnetically coupled sensor is configured to measure a voltage across the inductive coil induced by a magnetic field caused by the supply current.

Aspect 11 is the illumination device of any one of aspects 1 to 10, further comprising a carrier substrate holding the current path and the sensor, wherein the current path is arranged between the carrier substrate and the sensor.

Aspect 12 is the illumination device of any one of aspects 1 to 11, wherein the sensor and the processing circuitry are galvanically isolated from the current path.

Aspect 13 is the illumination device of any one of aspects 1 to 12, further comprising: an optical sensor configured to measure an optical power output by the light source and to output a third measurement signal indicative of the measured optical power; and/or a shunt resistor coupled in series between two sections of the current path, wherein the processing circuitry is configured to further determine the optical output power of the light source based on the measured optical power indicated by the third measurement signal and/or a voltage drop over the shunt resistor.

Aspect 14 is the illumination device of any one of aspects 1 to 13, further comprising switching circuitry comprising a plurality of coupled transistors for selectively switching the light source on and off, wherein the current path is part of the switching circuitry, and wherein the sensor is integrated into the switching circuitry.

Aspect 15 is the illumination device of any one of aspect 1 to 14, wherein the processing circuitry is further configured to control the current strength of the supply current through the current path based on the determined optical output power of the light source.

Aspect 16 is the illumination device of any one of aspect 1 to 15, wherein the processing circuitry is further configured to transmit control data to the sensor, and wherein the sensor is configured to adjust a sensor sensitivity based on the control data.

Aspect 17 is an optical camera. The optical camera comprises an illumination device according to any one of aspects 1 to 16. Further, the optical camera comprises an image sensor configured to generate measurement data based on received reflections of light output by the light source.

Aspect 18 is a method for monitoring an optical output power of a light source. The method comprises contactlessly measuring a current strength of a supply current for the light source flowing through a current path using a sensor. Additionally, the method comprises determining the optical output power of the light source based on the measured current strength.

The aspects and features described in relation to a particular one of the previous aspects may also be combined with one or more of the further aspects to replace an identical or similar feature of that further aspect or to additionally introduce the features into the further aspect.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further aspects, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate aspect. It should also be noted that although in the claims a dependent claim refers to a particular combination with one or more other claims, other aspects may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An illumination device, comprising:
   a light source;
   a current path configured to transport a supply current to the light source;
   a sensor configured to contactlessly measure a current strength of the supply current in the current path and to output a measurement signal indicative of the current strength;
   processing circuitry coupled to the sensor and configured to determine an optical output power of the light source based on the current strength indicated by the measurement signal; and
   an optical sensor configured to measure an optical power output by the light source and output a second measurement signal indicative of the optical power,
   wherein the processing circuitry is configured to further determine the optical output power of the light source based on the optical power indicated by the second measurement signal.

2. The illumination device of claim 1, wherein the sensor is coupled to the current path, electrically or magnetically.

3. The illumination device of claim 1, wherein the sensor is a magnetic field sensor.

4. The illumination device of claim 3, wherein the magnetic field sensor is configured to measure the current strength of the supply current using at least one of a Hall effect or a magnetoresistive effect.

5. The illumination device of claim 1, wherein the sensor is a magnetooptical sensor.

6. The illumination device of claim 1, wherein the sensor is a magnetically coupled sensor comprising an inductive coil used for measuring the current strength of the supply current.

7. The illumination device of claim 6, wherein the magnetically coupled sensor is configured to measure a voltage across the inductive coil induced by a magnetic field caused by the supply current.

8. The illumination device of claim 1, further comprising:
   a carrier substrate supporting the current path and the sensor, wherein the current path is arranged between the carrier substrate and the sensor.

9. The illumination device of claim 1, wherein the sensor and the processing circuitry are galvanically isolated from the current path.

10. The illumination device of claim 1, further comprising:
    switching circuitry comprising a plurality of coupled transistors for selectively switching the light source on and off, wherein the current path is part of the switching circuitry, and wherein the sensor is integrated into the switching circuitry.

11. The illumination device of claim 1, wherein the processing circuitry is further configured to control the current strength of the supply current through the current path based on the optical output power of the light source.

12. The illumination device of claim 1, further comprising:
    a shunt resistor coupled in series between two sections of the current path,
       wherein the processing circuitry is configured to further determine the optical output power of the light source based on the optical power indicated by the second measurement signal and a voltage drop over the shunt resistor.

13. An illumination device, comprising:
    a light source;
    a current path configured to transport a supply current to the light source;
    a sensor configured to contactlessly measure a current strength of the supply current in the current path and to output a measurement signal indicative of the current strength; and
    processing circuitry coupled to the sensor and configured to determine an optical output power of the light source based on the current strength indicated by the measurement signal,
    wherein the sensor is a first magnetic field sensor and the measurement signal is a first measurement signal,
    wherein the illumination device further comprises:

a second magnetic field sensor spaced apart from the first magnetic field sensor, wherein the second magnetic field sensor is configured to measure a magnetic field strength of a magnetic field in an environment of the illumination device and output a second measurement signal indicative of the magnetic field strength, and wherein the processing circuitry is coupled to the second magnetic field sensor and configured to further determine the optical output power of the light source based on the magnetic field strength indicated by the second measurement signal.

14. The illumination device of claim 13, further comprising:

an optical sensor configured to measure an optical power output by the light source and output a third measurement signal indicative of the optical power, wherein the processing circuitry is configured to further determine the optical output power of the light source based on the optical power indicated by the third measurement signal.

15. The illumination device of claim 14, further comprising:

a shunt resistor coupled in series between two sections of the current path, wherein the processing circuitry is configured to further determine the optical output power of the light source based on a voltage drop over the shunt resistor.

16. The illumination device of claim 13, further comprising:

a shunt resistor coupled in series between two sections of the current path, wherein the processing circuitry is configured to further determine the optical output power of the light source based on a voltage drop over the shunt resistor.

17. An optical camera, comprising:

an illumination device comprising:

a light source;

a current path configured to transport a supply current to the light source;

a sensor configured to contactlessly measure a current strength of the supply current in the current path and to output a measurement signal indicative of the current strength; and processing circuitry coupled to the sensor and configured to determine an optical output power of the light source based on the current strength indicated by the measurement signal; and an image sensor configured to generate measurement data based on received reflections of light output by the light source.

18. A method for monitoring an optical output power of a light source, the method comprising:

contactlessly measuring a current strength of a supply current for the light source flowing through a current path using a sensor;

performing at least one additional measurement; and determining the optical output power of the light source based on the current strength and the at least one additional measurement, wherein performing the at least one additional measurement includes:

measuring, by an optical sensor, an optical power output by the light source to provide a second measurement signal indicative of the optical power;

measuring, by a magnetic field sensor, a magnetic field strength of a magnetic field in an environment of the light source and provide a third measurement signal indicative of the magnetic field strength; or measuring a voltage drop over a shunt resistor coupled in series between two sections of the current path, wherein determining the optical output power of the light source includes at least one of:

determining the optical output power based on the current strength and the optical power indicated by the second measurement signal;

determining the optical output power based on the current strength and the magnetic field strength indicated by the third measurement signal; or determining the optical output power based on the current strength and the voltage drop over the shunt resistor.

19. An illumination device, comprising:

a light source;

a current path configured to transport a supply current to the light source;

a sensor configured to contactlessly measure a current strength of the supply current in the current path and to output a measurement signal indicative of the current strength;

processing circuitry coupled to the sensor and configured to determine an optical output power of the light source based on the current strength indicated by the measurement signal; and a shunt resistor coupled in series between two sections of the current path, wherein the processing circuitry is configured to further determine the optical output power of the light source based on a voltage drop over the shunt resistor.

* * * * *